(12) United States Patent
Wright et al.

(10) Patent No.: US 8,050,000 B2
(45) Date of Patent: *Nov. 1, 2011

(54) MICRO-ELECTROMECHANICAL SYSTEM BASED ARC-LESS SWITCHING WITH CIRCUITRY FOR ABSORBING ELECTRICAL ENERGY DURING A FAULT CONDITION

(75) Inventors: Joshua Isaac Wright, Minneapolis, MN (US); Kanakasabqapathi Subramanian, Chennai (IN); William James Premerlani, Scotia, NY (US); John Norton Park, Rexford, NY (US)

(73) Assignee: General Electric Company, Niskayuna, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/967,526

(22) Filed: Dec. 14, 2010

(65) Prior Publication Data

US 2011/0096444 A1    Apr. 28, 2011

Related U.S. Application Data

(63) Continuation of application No. 11/563,726, filed on Nov. 28, 2006, now Pat. No. 7,876,538, which is a continuation-in-part of application No. 11/314,336, filed on Dec. 20, 2005, now abandoned.

(51) Int. Cl.
  *H02H 3/00* (2006.01)
(52) U.S. Cl. .......................................... 361/2
(58) Field of Classification Search ........................ 361/2
  See application file for complete search history.

(56) References Cited

U.S. PATENT DOCUMENTS

| 4,500,934 | A | 2/1985 | Kinsinger |
| 4,700,256 | A | 10/1987 | Howell |
| 4,723,187 | A | 2/1988 | Howell |
| 4,920,448 | A | 4/1990 | Bonhomme |
| 5,339,210 | A | 8/1994 | Howell |
| 5,374,792 | A | 12/1994 | Ghezzo et al. |
| 5,430,597 | A | 7/1995 | Bagepalli et al. |
| 6,563,683 | B1 | 5/2003 | Strumpler |
| 6,738,246 | B1 | 5/2004 | Strumpler |
| 6,760,202 | B1 | 7/2004 | Meyer et al. |
| 7,876,538 | B2 * | 1/2011 | Wright et al. ............ 361/2 |
| 2003/0183838 | A1 | 10/2003 | Huang et al. |
| 2005/0146404 | A1 | 7/2005 | Yeatman |
| 2005/0146814 | A1 | 7/2005 | Sellier et al. |

FOREIGN PATENT DOCUMENTS

DE    19846639 A1    4/2000

OTHER PUBLICATIONS

Lee et al., "Integrated Microrelays: Concept and Initial Results", Journal of Microelectromechanical Systems, vol. 11, No. 2, pp. 147-153, Apr. 2002.

* cited by examiner

*Primary Examiner* — Jared Fureman
*Assistant Examiner* — Nicholas Ieva
(74) *Attorney, Agent, or Firm* — Richard D. Emery

(57) ABSTRACT

A system is presented. The system includes a micro-electromechanical system switch. Further, the system includes a balanced diode bridge configured to suppress arc formation between contacts of the micro-electromechanical system switch. A pulse circuit is coupled to the balanced diode bridge to form a pulse signal in response to a fault condition. An energy-absorbing circuitry is coupled in a parallel circuit with the pulse circuit and is adapted to absorb electrical energy resulting from the fault condition without affecting a pulse signal formation by the pulse circuit.

20 Claims, 10 Drawing Sheets

US 8,050,000 B2

MICRO-ELECTROMECHANICAL SYSTEM BASED ARC-LESS SWITCHING WITH CIRCUITRY FOR ABSORBING ELECTRICAL ENERGY DURING A FAULT CONDITION

RELATED APPLICATIONS

The present application is a continuation of U.S. patent application Ser. No. 11/563,726, filed on Nov. 28, 2006, which is a continuation-in-part of U.S. patent application Ser. No. 11/314,336 filed on Dec. 20, 2005, both of which are incorporated by reference in their entirety herein.

BACKGROUND

Embodiments relate generally to a switching device for switching off a current in a current path, and more particularly to micro-electromechanical system based switching devices.

A circuit breaker is an electrical device designed to protect electrical equipment from damage caused by faults in the circuit. Traditionally, most conventional circuit breakers include bulky electromechanical switches. Unfortunately, these conventional circuit breakers are large in size thereby necessitating use of a large force to activate the switching mechanism. Additionally, the switches of these circuit breakers generally operate at relatively slow speeds. Furthermore, these circuit breakers are disadvantageously complex to build and thus expensive to fabricate. In addition, when contacts of the switching mechanism in conventional circuit breakers are physically separated, an arc is typically formed therebetween, which arc continues to carry current until the current in the circuit ceases. Moreover, energy associated with the arc may seriously damage the contacts and/or present a burn hazard to personnel.

As an alternative to slow electromechanical switches, fast solid-state switches have been employed in high speed switching applications. As will be appreciated, these solid-state switches switch between a conducting state and a non-conducting state through controlled application of a voltage or bias. For example, by reverse biasing a solid-state switch, the switch may be transitioned into a non-conducting state. However, since solid-state switches do not create a physical gap between contacts when they are switched into a non-conducting state, they experience leakage current. Furthermore, due to internal resistances, when solid-state switches operate in a conducting state, they experience a voltage drop. Both the voltage drop and leakage current contribute to the generation of excess heat under normal operating circumstances, which may be detrimental to switch performance and life. Moreover, due at least in part to the inherent leakage current associated with solid-state switches, their use in circuit breaker applications is not possible.

BRIEF DESCRIPTION

Briefly, in accordance with aspects of the present technique, a system is presented. The system includes a micro-electromechanical system switch. A balanced diode bridge is configured to suppress arc formation between contacts of the micro-electromechanical system switch. A pulse circuit is coupled to the balanced diode bridge. The pulse circuit comprises a pulse capacitor adapted to form a pulse signal for causing flow of a pulse current through the balanced diode bridge. The pulse signal is generated in response to a fault condition in a load circuit coupled to the micro-electromechanical system switch. An energy-absorbing circuitry is coupled in a parallel circuit with the pulse circuit. The energy-absorbing circuitry comprises an energy-absorbing capacitor adapted to absorb electrical energy resulting from the fault condition without affecting a pulse signal formation by the pulse circuit.

In accordance with further aspects of the present technique a system is presented. The system includes switching circuitry comprising a micro-electromechanical system switch configured to switch the system from a first switching state to a second switching state. An arc suppression circuitry is coupled to the switching circuitry, wherein the arc suppression circuitry is configured to suppress an arc formation between contacts of the micro-electromechanical system switch. Detection circuitry is coupled to the arc suppression circuitry and configured to determine existence of a fault condition. A pulse circuit is coupled to the arc suppression circuitry and the detection circuitry, wherein the pulse circuit is configured to form a pulse signal responsive to the fault condition, and wherein the pulse signal is applied to the arc suppression circuitry in connection with initiating an opening of the micro-electromechanical system switch. An energy-absorbing circuitry coupled in a parallel circuit with the pulse circuit. The energy-absorbing circuitry is adapted to absorb electrical energy resulting from the fault condition without affecting a pulse signal formation by the pulse circuit.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

In accordance with one or more embodiments of the present invention, systems and methods for micro-electromechanical system based arc-less switching is described herein. In the following detailed description, numerous specific details are set forth in order to provide a thorough understanding of various embodiments of the present invention. However, those skilled in the art will understand that embodiments of the present invention may be practiced without these specific details, that the present invention is not limited to the depicted embodiments, and that the present invention may be practiced in a variety of alternative embodiments. In other instances, well known methods, procedures, and components have not been described in detail.

Furthermore, various operations may be described as multiple discrete steps performed in a manner that is helpful for understanding embodiments of the present invention. However, the order of description should not be construed as to imply that these operations need be performed in the order they are presented, nor that they are even order dependent. Moreover, repeated usage of the phrase "in one embodiment" does not necessarily refer to the same embodiment, although it may. Lastly, the terms "comprising", "including", "having", and the like, as used in the present application, are intended to be synonymous unless otherwise indicated.

Figure 1:
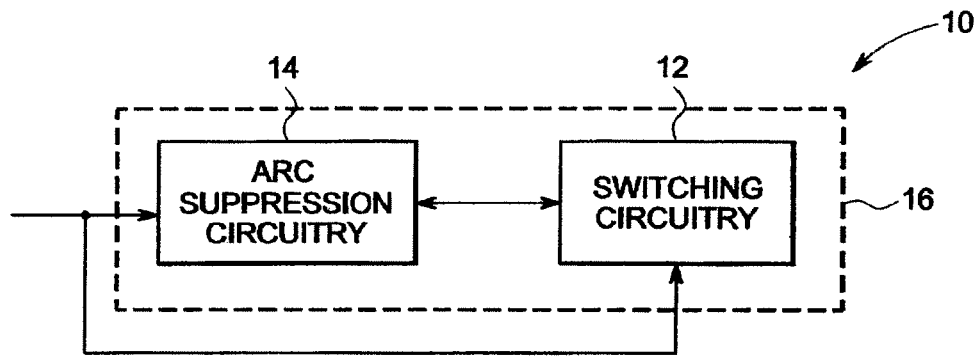
FIG. 1 is a block diagram of an exemplary MEMS based switching system, in accordance with aspects of the present technique.

FIG. 1 illustrates a block diagram of an exemplary arc-less micro-electromechanical system switch (MEMS) based switching system 10, in accordance with aspects of the present invention. Presently, MEMS generally refer to micron-scale structures that for example can integrate a multiplicity of functionally distinct elements, e.g., mechanical elements, electromechanical elements, sensors, actuators, and electronics, on a common substrate through micro-fabrication technology. It is contemplated, however, that many techniques and structures presently available in MEMS devices will in just a few years be available via nanotechnology-based devices, e.g., structures that may be smaller than 100 nanometers in size. Accordingly, even though example embodiments described throughout this document may refer to MEMS-based switching devices, it is submitted that the inventive aspects of the present invention should be broadly construed and should not be limited to micron-sized devices.

As illustrated in FIG. 1, the arc-less MEMS based switching system 10 is shown as including MEMS based switching circuitry 12 and arc suppression circuitry 14, where the arc suppression circuitry 14 is operatively coupled to the MEMS based switching circuitry 12. In certain embodiments, the MEMS based switching circuitry 12 may be integrated in its entirety with the arc suppression circuitry 14 in a single package 16, for example. In other embodiments, only certain portions or components of the MEMS based switching circuitry 12 may be integrated with the arc suppression circuitry 14.

In a presently contemplated configuration as will be described in greater detail with reference to FIGS. 2-5, the MEMS based switching circuitry 12 may include one or more MEMS switches. Additionally, the arc suppression circuitry 14 may include a balanced diode bridge and a pulse circuit. Further, the arc suppression circuitry 14 may be configured to facilitate suppression of an arc formation between contacts of the one or more MEMS switches. It may be noted that the arc suppression circuitry 14 may be configured to facilitate suppression of an arc formation in response to an alternating current (AC) or a direct current (DC).

Figure 2:
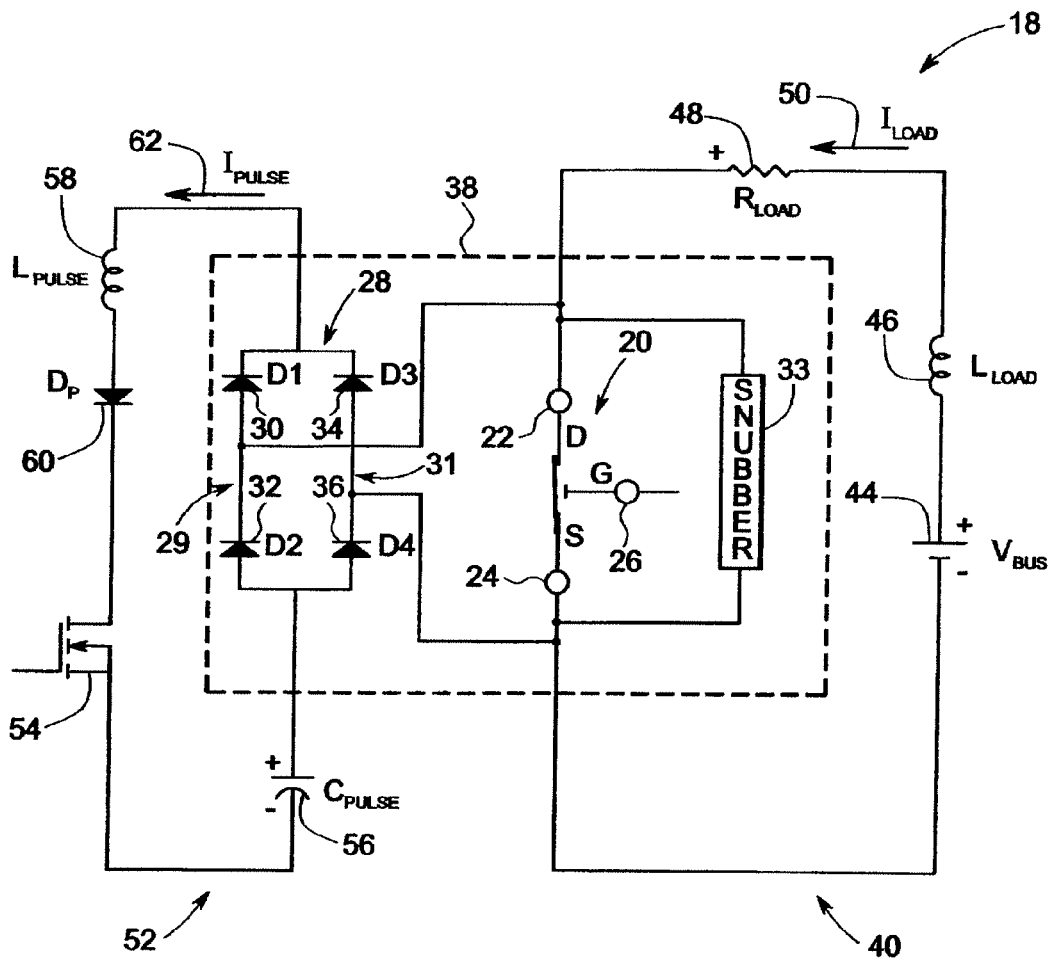
FIG. 2 is schematic diagram illustrating the exemplary MEMS based switching system depicted in FIG. 1.

Turning now to FIG. 2, a schematic diagram 18 of the exemplary arc-less MEMS based switching system depicted in FIG. 1 is illustrated in accordance with one embodiment. As noted with reference to FIG. 1, the MEMS based switching circuitry 12 may include one or more MEMS switches. In the illustrated embodiment, a first MEMS switch 20 is depicted as having a first contact 22, a second contact 24 and a third contact 26. In one embodiment, the first contact 22 may be configured as a drain, the second contact 24 may be configured as a source and the third contact 26 may be configured as a gate. Furthermore, as illustrated in FIG. 2, a voltage snubber circuit 33 may be coupled in parallel with the MEMS switch 20 and configured to limit voltage overshoot during fast contact separation as will be explained in greater detail hereinafter. In certain embodiments, the snubber circuit 33 may include a snubber capacitor (not shown) coupled in series with a snubber resistor (not shown). The snubber capacitor may facilitate improvement in transient voltage sharing during the sequencing of the opening of the MEMS switch 20. Furthermore, the snubber resistor may suppress any pulse of current generated by the snubber capacitor during closing operation of the MEMS switch 20. In certain other embodiments, the voltage snubber circuit 33 may include a metal oxide varistor (MOV) (not shown).

In accordance with further aspects of the present technique, a load circuit 40 may be coupled in series with the first MEMS switch 20. The load circuit 40 may include a voltage source $V_{BUS}$ 44. In addition, the load circuit 40 may also include a load inductance 46 $L_{LOAD}$, where the load inductance $L_{LOAD}$ 46 is representative of a combined load inductance and a bus inductance viewed by the load circuit 40. The load circuit 40 may also include a load resistance $R_{LOAD}$ 48 representative of a combined load resistance viewed by the load circuit 40. Reference numeral 50 is representative of a load circuit current $I_{LOAD}$ that may flow through the load circuit 40 and the first MEMS switch 20.

Further, as noted with reference to FIG. 1, the arc suppression circuitry 14 may include a balanced diode bridge. In the illustrated embodiment, a balanced diode bridge 28 is depicted as having a first branch 29 and a second branch 31. As used herein, the term "balanced diode bridge" is used to represent a diode bridge that is configured such that voltage drops across both the first and second branches 29, 31 are substantially equal. The first branch 29 of the balanced diode bridge 28 may include a first diode D1 30 and a second diode D2 32 coupled together to form a first series circuit. In a similar fashion, the second branch 31 of the balanced diode bridge 28 may include a third diode D3 34 and a fourth diode D4 36 operatively coupled together to form a second series circuit.

In one embodiment, the first MEMS switch 20 may be coupled in parallel across midpoints of the balanced diode bridge 28. The midpoints of the balanced diode bridge may include a first midpoint located between the first and second diodes 30, 32 and a second midpoint located between the third and fourth diodes 34, 36. Furthermore, the first MEMS switch 20 and the balanced diode bridge 28 may be tightly packaged to facilitate minimization of parasitic inductance caused by the balanced diode bridge 28 and in particular, the connections to the MEMS switch 20. It may be noted that, in accordance with exemplary aspects of the present technique, the first MEMS switch 20 and the balanced diode bridge 28 are positioned relative to one another such that the inherent inductance between the first MEMS switch 20 and the balanced diode bridge 28 produces a di/dt voltage less than a few percent of the voltage across the drain 22 and source 24 of the MEMS switch 20 when carrying a transfer of the load current to the diode bridge 28 during the MEMS switch 20 turn-off which will be described in greater detail hereinafter. In one embodiment, the first MEMS switch 20 may be integrated with the balanced diode bridge 28 in a single package 38 or optionally, the same die with the intention of minimizing the inductance interconnecting the MEMS switch 20 and the diode bridge 28.

Additionally, the arc suppression circuitry 14 may include a pulse circuit 52 coupled in operative association with the balanced diode bridge 28. The pulse circuit 52 may be configured to detect a switch condition and initiate opening of the MEMS switch 20 responsive to the switch condition. As used herein, the term "switch condition" refers to a condition that triggers changing a present operating state of the MEMS switch 20. For example, the switch condition may result in changing a first closed state of the MEMS switch 20 to a second open state or a first open state of the MEMS switch 20 to a second closed state. A switch condition may occur in response to a number of actions including but not limited to a circuit fault or switch ON/OFF request.

The pulse circuit 52 may include a pulse switch 54 and a pulse capacitor $C_{PULSE}$ 56 series coupled to the pulse switch 54. Further, the pulse circuit may also include a pulse inductance $L_{PULSE}$ 58 and a first diode $D_P$ 60 coupled in series with the pulse switch 54. The pulse inductance $L_{PULSE}$ 58, the diode $D_P$ 60, the pulse switch 54 and the pulse capacitor $C_{PULSE}$ 56 may be coupled in series to form a first branch of the pulse circuit 52, where the components of the first branch may be configured to facilitate pulse current shaping and timing. Also, reference numeral 62 is representative of a pulse circuit current $I_{PULSE}$ that may flow through the pulse circuit 52.

In accordance with aspects of the present invention as will be described in further detail hereinafter, the MEMS switch 20 may be rapidly switched (e.g., on the order of picoseconds or nanoseconds) from a first closed state to a second open state while carrying a current albeit at a near-zero voltage. This may be achieved through the combined operation of the load circuit 40, and pulse circuit 52 including the balanced diode bridge 28 coupled in parallel across contacts of the MEMS switch 20.

Figure 3:
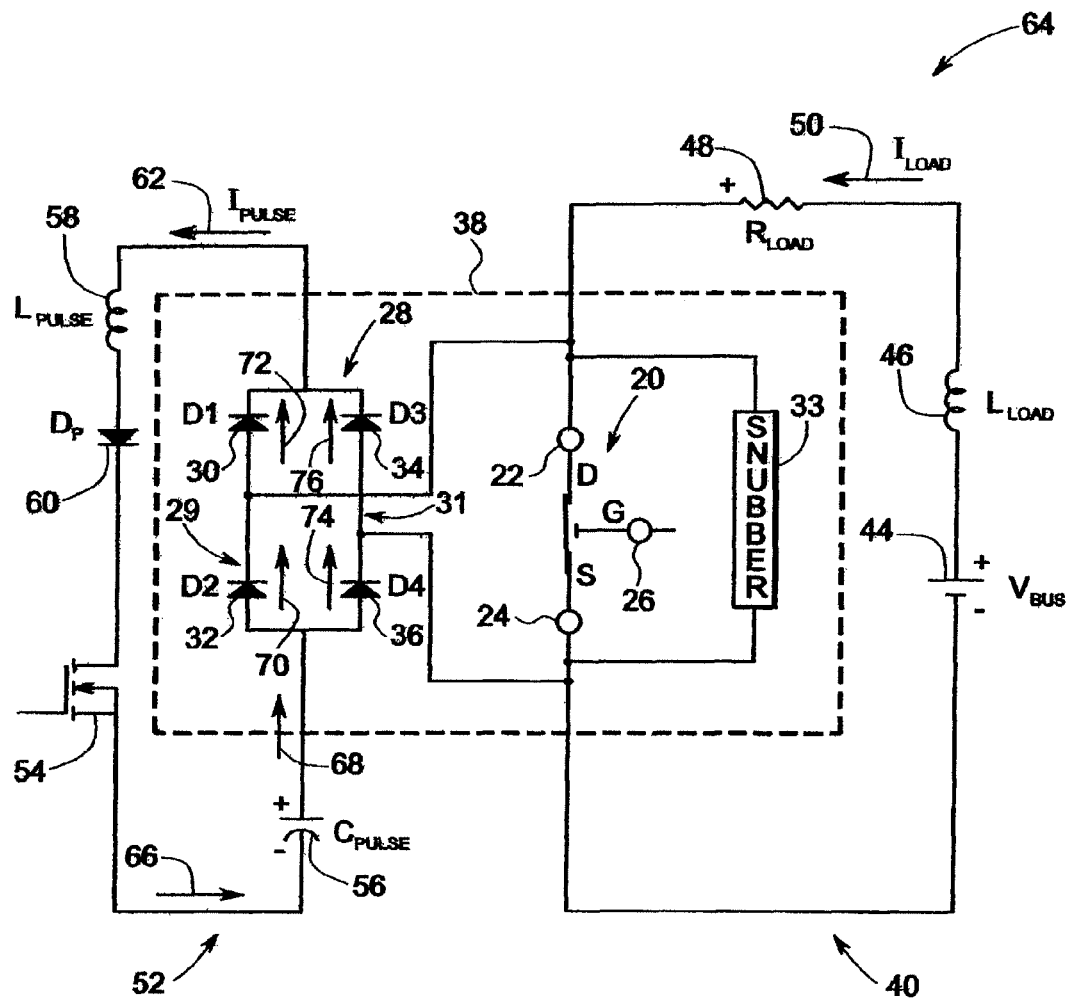
FIGS. 3-5 are schematic flow charts illustrating an example operation of the MEMS based switching system illustrated in FIG. 2.
Figure 4:
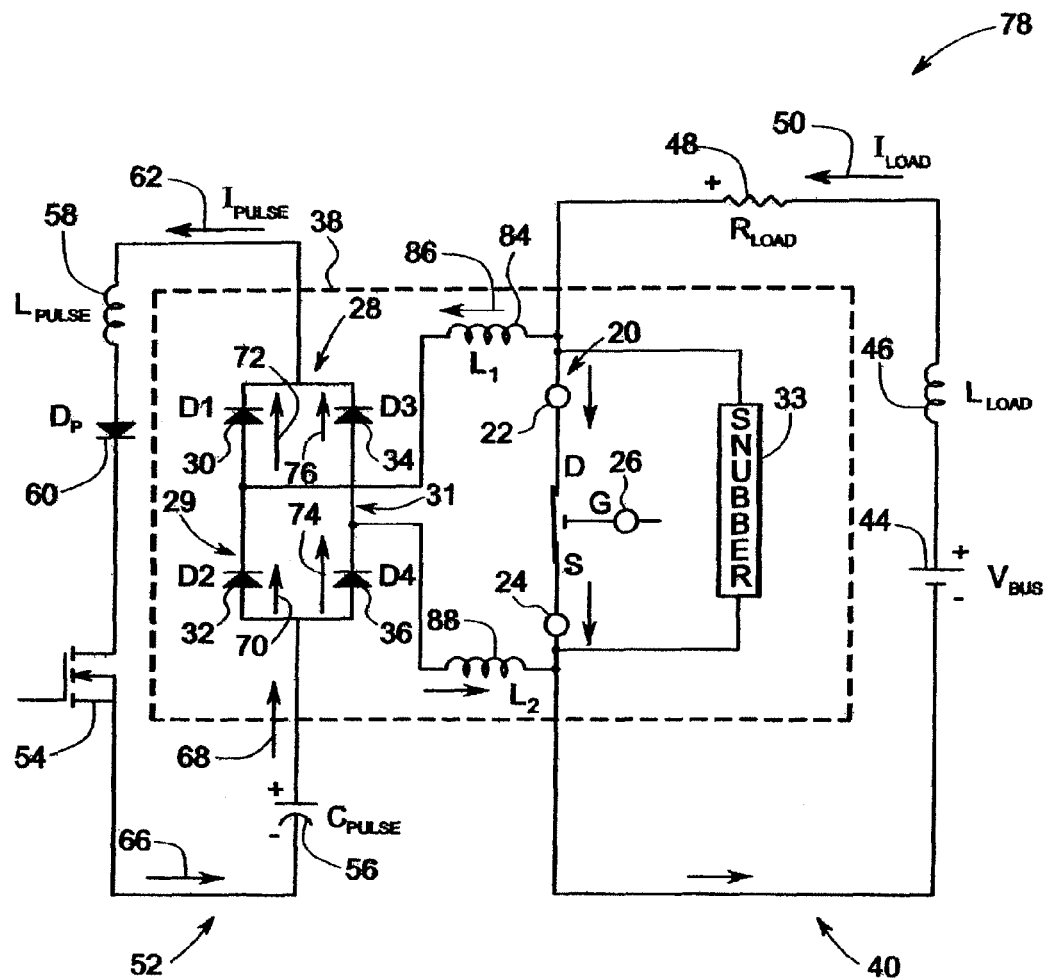
Figure 5:
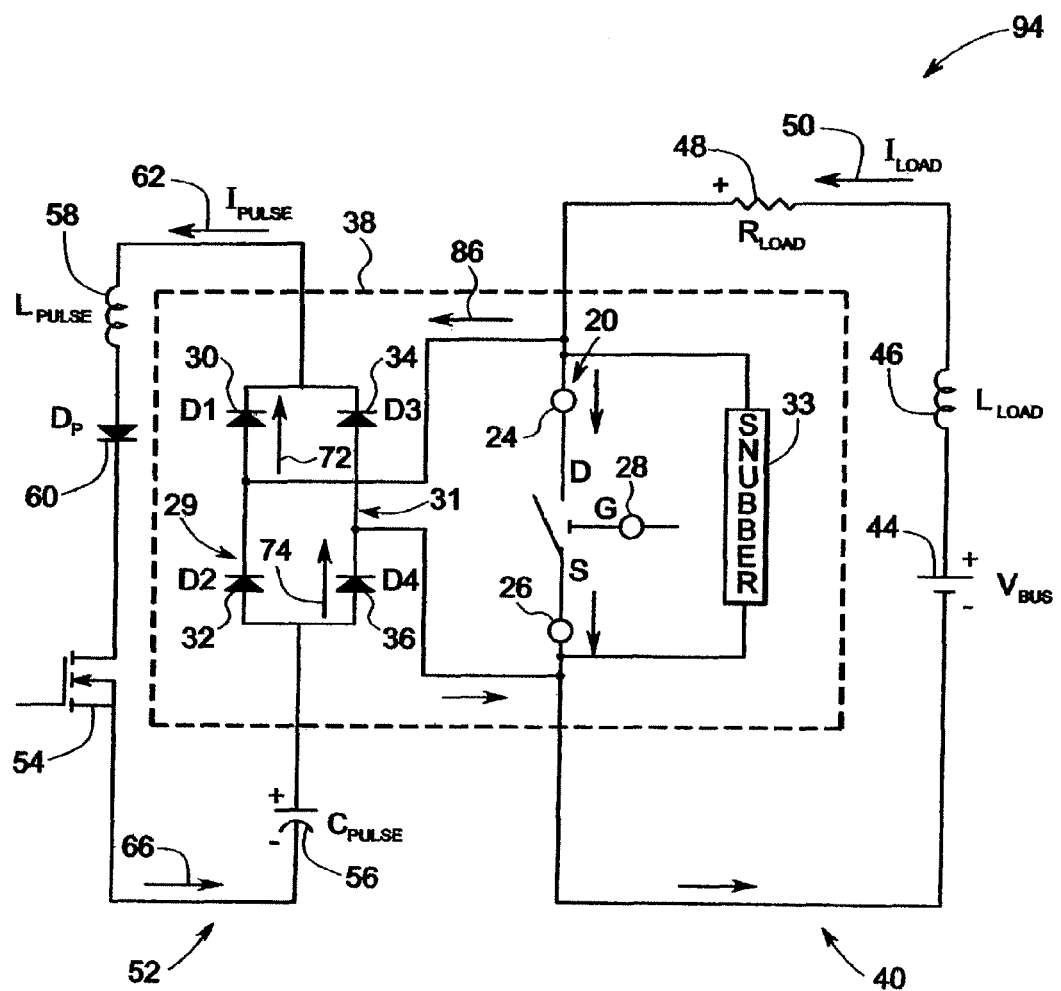

FIGS. 3-5 are used as schematic flow charts to illustrate an example operation of the arc-less MEMS based switching system 18 illustrated in FIG. 2. With continuing reference to FIG. 2, an initial condition of the example operation of the arc-less MEMS based switching system 18 is illustrated. The MEMS switch 20 is depicted as starting in a first closed state. Also, as indicated, there is a load current $I_{LOAD}$ 50 that has a value substantially equal to $V_{BUS}/R_{LOAD}$ in the load circuit 40.

Moreover, for discussion of this example operation of the arc-less MEMS based switching system 18, it may be assumed that a resistance associated with the MEMS switch 20 is sufficiently small such that the voltage produced by the load current through the resistance of MEMS switch 20 has only a negligible effect on the near-zero voltage difference between the mid-points of the diode bridge 28 when pulsed. For example, the resistance associated with the MEMS switch 20 may be assumed to be sufficiently small so as to produce a voltage drop of less than a few millivolts due to the maximum anticipated load current.

It may be noted that in this initial condition of the MEMS based switching system 18, the pulse switch 54 is in a first open state. Additionally, there is no pulse circuit current in the pulse circuit 52. Also, in the pulse circuit 52, the capacitor $C_{PULSE}$ 56 may be pre-charged to a voltage $V_{PULSE}$, where $V_{PULSE}$ is a voltage that can produce a half sinusoid of pulse current having a peak magnitude significantly greater (e.g., twice) the anticipated load current $I_{LOAD}$ 50 during the transfer interval of the load current. It may be noted that $C_{PULSE}$ 56 and $L_{PULSE}$ 58 may be selected so as to resonate with each other.

FIG. 3 illustrates a schematic diagram 64 depicting a process of triggering the pulse circuit 52. It may be noted that detection circuitry (not shown) may be coupled to the pulse circuit 52. The detection circuitry may include sensing circuitry (not shown) configured to sense a level of the load circuit current $I_{LOAD}$ 50 and/or a voltage level of the voltage source $V_{BUS}$ 44, for example. Furthermore, the detection circuitry may be configured to detect a switch condition as described above. In one embodiment, the switch condition may occur due to the current level and/or the voltage level exceeding a predetermined threshold.

The pulse circuit 52 may be configured to detect the switch condition to facilitate switching the present closed state of the MEMS switch 20 to a second open state. In one embodiment, the switch condition may be a fault condition generated due to a voltage level or load current in the load circuit 40 exceeding a predetermined threshold level. However, as will be appreciated, the switch condition may also include monitoring a ramp voltage to achieve a given system-dependent ON time for the MEMS switch 20.

In one embodiment, the pulse switch 54 may generate a sinusoidal pulse responsive to receiving a trigger signal as a result of a detected switching condition. The triggering of the pulse switch 54 may initiate a resonant sinusoidal current in the pulse circuit 52. The current direction of the pulse circuit current may be represented by reference numerals 66 and 68. Furthermore, the current direction and relative magnitude of the pulse circuit current through the first diode 30 and the second diode 32 of the first branch 29 of the balanced diode bridge 28 may be represented by current vectors 72 and 70 respectively. Similarly, current vectors 76 and 74 are representative of a current direction and relative magnitude of the pulse circuit current through the third diode 34 and the fourth diode 36 respectively.

The value of the peak sinusoidal bridge pulse current may be determined by the initial voltage on the pulse capacitor $C_{PULSE}$ 56, value of the pulse capacitor $C_{PULSE}$ 56 and the value of the pulse inductance $L_{PULSE}$ 58. The values for the pulse inductance $L_{PULSE}$ 58 and the pulse capacitor $C_{PULSE}$ 56 also determine the pulse width of the half sinusoid of pulse current. The bridge current pulse width may be adjusted to meet the system load current turn-off requirement predicated upon the rate of change of the load current ($V_{BUS}/I_{LOAD}$) and the desired peak let-through current during a load fault condition. According to aspects of the present invention, the pulse switch 54 may be configured to be in a conducting state prior to opening the MEMS switch 20.

It may be noted that triggering of the pulse switch 54 may include controlling a timing of the pulse circuit current $I_{PULSE}$ 62 through the balanced diode bridge 28 to facilitate creating a lower impedance path as compared to the impedance of a path through the contacts of the MEMS switch 20 during an opening interval. In addition, the pulse switch 54 may be triggered such that a desired voltage drop is presented across the contacts of the MEMS switch 20.

In one embodiment, the pulse switch 54 may be a solid-state switch that may be configured to have switching speeds in the range of nanoseconds to microseconds, for example. The switching speed of the pulse switch 54 should be relatively fast compared to the anticipated rise time of the load current in a fault condition. The current rating of the MEMS switch 20 is dependent on the rate of rise of the load current, which in turn is dependent on the inductance $L_{LOAD}$ 46 and the bus supply voltage $V_{BUS}$ 44 in the load circuit 40 as previously noted. The MEMS switch 20 may be appropriately rated to handle a larger load current $I_{LOAD}$ 50 if the load current $I_{LOAD}$ 50 may rise rapidly compared to the speed capability of the bridge pulse circuit.

The pulse circuit current $I_{PULSE}$ 62 increases from a value of zero and divides equally between the first and second branches 29, 31 of the balanced diode bridge 28. In accordance with one embodiment, the difference in voltage drops across the branches 29, 31 of the balanced diode bridge 28 may be designed to be negligible, as previously described. Further, as previously described, the diode bridge 28 is balanced such that the voltage drop across the first and second branches of the diode bridge 28 are substantially equal. Moreover, as the resistance of the MEMS switch 20 in a present closed state is relatively low, there is a relatively small voltage drop across the MEMS switch 20. However, if the voltage drop across the MEMS switch 20 happened to be larger (e.g., due to an inherent design of the MEMS switch), the balancing of the diode bridge 28 may be affected as the diode bridge 28 is operatively coupled in parallel with the MEMS switch 20. In accordance with aspects of the present invention, if the resistance of the MEMS switch 20 causes a significant voltage drop across the MEMS switch 20 then the diode bridge 28 may accommodate the resulting imbalance of the pulse bridge by increasing the magnitude of the peak bridge pulse current.

Referring now to FIG. 4, a schematic diagram 78 is illustrated in which opening of the MEMS switch 20 is initiated. As previously noted, the pulse switch 54 in the pulse circuit 52 is triggered prior to opening the MEMS switch 20. As the pulse current $I_{PULSE}$ 62 increases, the voltage across the pulse capacitor $C_{PULSE}$ 56 decreases due to the resonant action of the pulse circuit 52. In the ON condition in which the switch is closed and conducting, the MEMS switch 20 presents a path of relatively low impedance for the load circuit current $I_{LOAD}$ 50.

Once the amplitude of the pulse circuit current $I_{PULSE}$ 62 becomes greater than the amplitude of the load circuit current $I_{LOAD}$ 50 (e.g., due to the resonant action of the pulse circuit 52), a voltage applied to the gate contact 26 of the MEMS switch 20 may be appropriately biased to switch the present operating state of the MEMS switch 20 from the first closed and conducting state to an increasing resistance condition in which the MEMS switch 20 starts to turn off (e.g., where the contacts are still closed but contact pressure diminishing due the switch opening process) which causes the switch resistance to increase which in turn causes the load current to start to divert from the MEMS switch 20 into the diode bridge 28.

In this present condition, the balanced diode bridge 28 presents a path of relatively low impedance to the load circuit current $I_{LOAD}$ 50 as compared to a path through the MEMS switch 20, which now exhibits an increasing contact resistance. It may be noted that this diversion of load circuit current $I_{LOAD}$ 50 through the MEMS switch 20 is an extremely fast process compared to the rate of change of the load circuit current $I_{LOAD}$ 50. As previously noted, it may be desirable that the values of inductances $L_1$ 84 and $L_2$ 88 associated with connections between the MEMS switch 20 and the balanced diode bridge 28 be very small to avoid inhibition of the fast current diversion.

The process of current transfer from the MEMS switch 20 to the pulse bridge continues to increase the current in the first diode 30 and the fourth diode 36 while simultaneously the current in the second diode 32 and the third diode 34 diminish. The transfer process is completed when the mechanical contacts 22, 24 of the MEMS switch 20 are separated to form a physical gap and all of the load current is carried by the first diode 30 and the fourth diode 36.

Consequent to the load circuit current $I_{LOAD}$ being diverted from the MEMS switch 20 to the diode bridge 28 in direction 86, an imbalance forms across the first and second branches 29, 31 of the diode bridge 28. Furthermore, as the pulse circuit current decays, voltage across the pulse capacitor $C_{PULSE}$ 56 continues to reverse (e.g., acting as a "back electro-motive force") which causes the eventual reduction of the load circuit current $I_{LOAD}$ to zero. The second diode 32 and the third diode 34 in the diode bridge 28 become reverse biased which results in the load circuit now including the pulse inductor $L_{PULSE}$ 58 and the bridge pulse capacitor $C_{PULSE}$ 56 and to become a series resonant circuit.

Turning now to FIG. 5, a schematic diagram 94 for the circuit elements connected for the process of decreasing the load current is illustrated. As alluded to above, at the instant that the contacts of the MEMS switch 20 part, infinite contact resistance is achieved. Furthermore, the diode bridge 28 no longer maintains a near-zero voltage across the contacts of the MEMS switch 20. Also, the load circuit current $I_{LOAD}$ is now equal to the current through the first diode 30 and the fourth diode 36. As previously noted, there is now no current through the second diode 32 and the third diode 34 of the diode bridge 28.

Additionally, a significant switch contact voltage difference from the drain 24 to the source 26 of the MEMS switch 20 may now rise to a maximum of approximately twice the $V_{BUS}$ voltage at a rate determined by the net resonant circuit which includes the pulse inductor $L_{PULSE}$ 58, the pulse capacitor $C_{PULSE}$ 56, the load circuit inductor $L_{LOAD}$ 46, and damping due to the load resistor $R_{LOAD}$ 48 and circuit losses. Moreover, the pulse circuit current $I_{PULSE}$ 62, that is now equal to the load circuit current $I_{LOAD}$ 50, may resonantly decrease to a zero value and to maintain the zero value due to the reverse blocking action of the diode bridge 28 and the diode $D_P$ 60. The voltage across the pulse capacitor $C_{PULSE}$ 56 has reversed resonantly to a negative peak and will maintain the negative peak value until the pulse capacitor $C_{PULSE}$ 56 is recharged.

The diode bridge 28 may be configured to maintain a near-zero voltage across the contacts of the MEMS switch 20 until the contacts separate to open the MEMS switch 20, thereby preventing damage by suppressing any arc that would tend to form between the contacts of the MEMS switch 20 during opening. Additionally, the contacts of the MEMS switch 20 approach the opened state at a much reduced contact current through the MEMS switch 20. Also, any stored energy in the circuit inductance, the load inductance and the source may be transferred to the pulse circuit capacitor $C_{PULSE}$ 56 and may be absorbed via voltage dissipation circuitry (not shown). The voltage snubber circuit 33 may be configured to limit voltage overshoot during the fast contact separation due to the inductive energy remaining in the interface inductance between the bridge and the MEMS switch. Furthermore, the rate of increase of reapply voltage across the contacts of the MEMS switch 20 during opening may be controlled via use of the snubber circuit (not shown).

It may also be noted that although a gap is created between the contacts of the MEMS switch 20 when in an open state, a leakage current may nonetheless exist between the load circuit 40 and the diode bridge circuit 28 around the MEMS switch 20. This leakage current may be suppressed via introduction of a secondary mechanical switch (not shown) series connected in the load circuit 40 to generate a physical gap. In certain embodiments, the mechanical switch may include a second MEMS switch.

Figure 6:
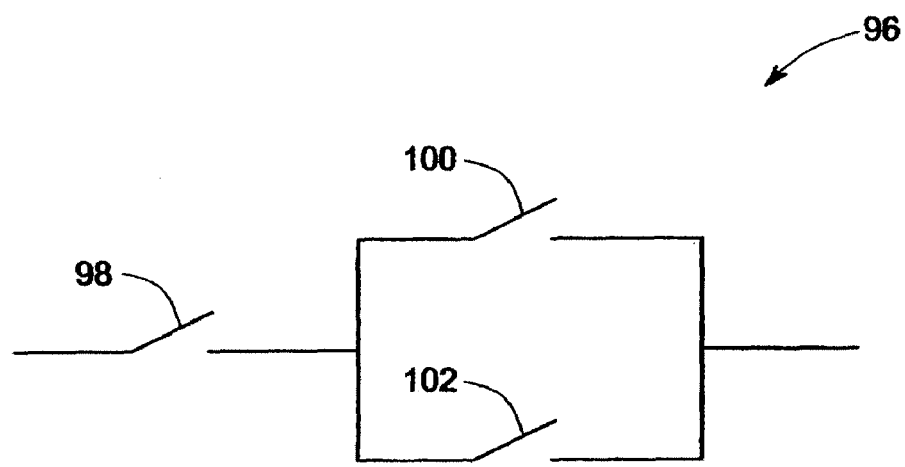
FIG. 6 is schematic diagram illustrating a series-parallel array of MEMS switches.

FIG. 6 illustrates an exemplary embodiment 96 wherein the switching circuitry 12 (see FIG. 1) may include multiple MEMS switches arranged in a series or series-parallel array, for example. Additionally, as illustrated in FIG. 6, the MEMS switch 20 may replaced by a first set of two or more MEMS switches 98, 100 electrically coupled in a series circuit. In one embodiment, at least one of the first set of MEMS switches 98, 100 may be further coupled in a parallel circuit, where the parallel circuit may include a second set of two or more MEMS switches (e.g., reference numerals 100, 102). In accordance with aspects of the present invention, a static grading resistor and a dynamic grading capacitor may be coupled in parallel with at least one of the first or second set of MEMS switches.

Figure 7:
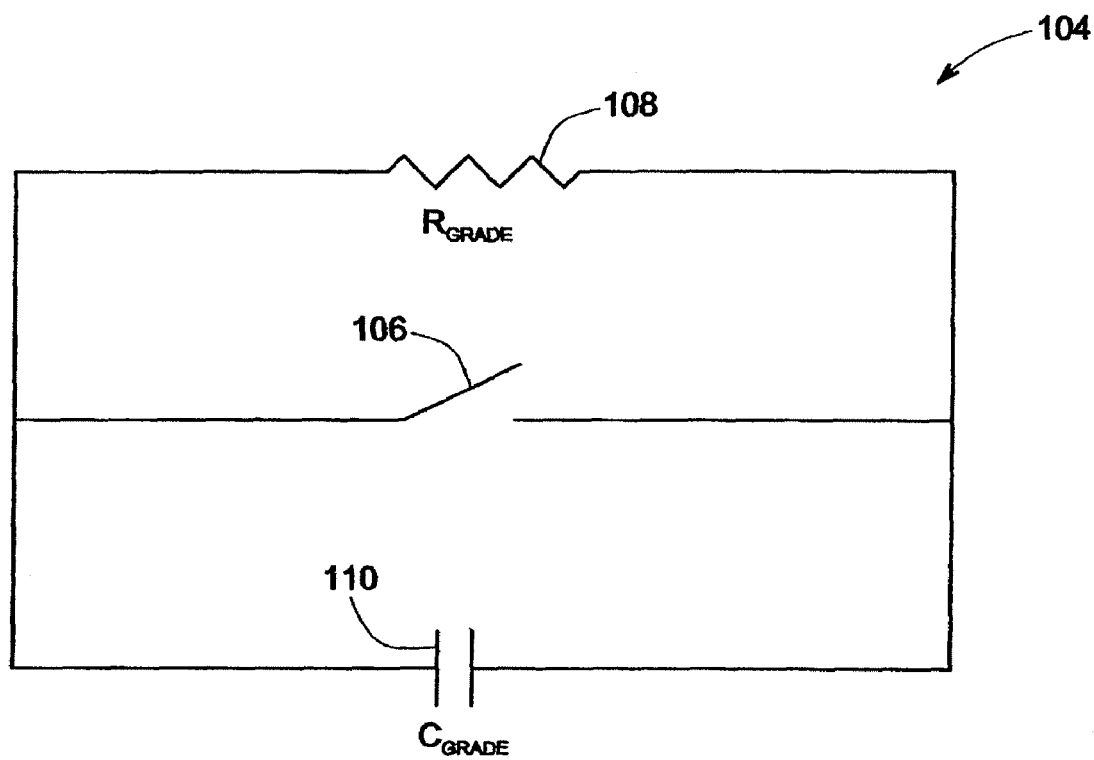
FIG. 7 is schematic diagram illustrating a graded MEMS switch.

Referring now to FIG. 7, an exemplary embodiment 104 of a graded MEMS switch circuit is depicted. The graded switch circuit 104 may include at least one MEMS switch 106, a grading resistor 108, and a grading capacitor 110. The graded switch circuit 104 may include multiple MEMS switches arranged in a series or series-parallel array as for example illustrated in FIG. 6. The grading resistor 108 may be coupled in parallel with at least one MEMS switch 106 to provide voltage grading for the switch array. In an exemplary embodiment, the grading resistor 108 may be sized to provide adequate steady state voltage balancing (division) among the series switches while providing acceptable leakage for the particular application. Furthermore, both the grading capacitor 110 and grading resistor 108 may be provided in parallel with each MEMS switch 106 of the array to provide sharing both dynamically during switching and statically in the OFF state. It may be noted that additional grading resistors or grading capacitors or both may be added to each MEMS switch in the switch array.

Figure 8:
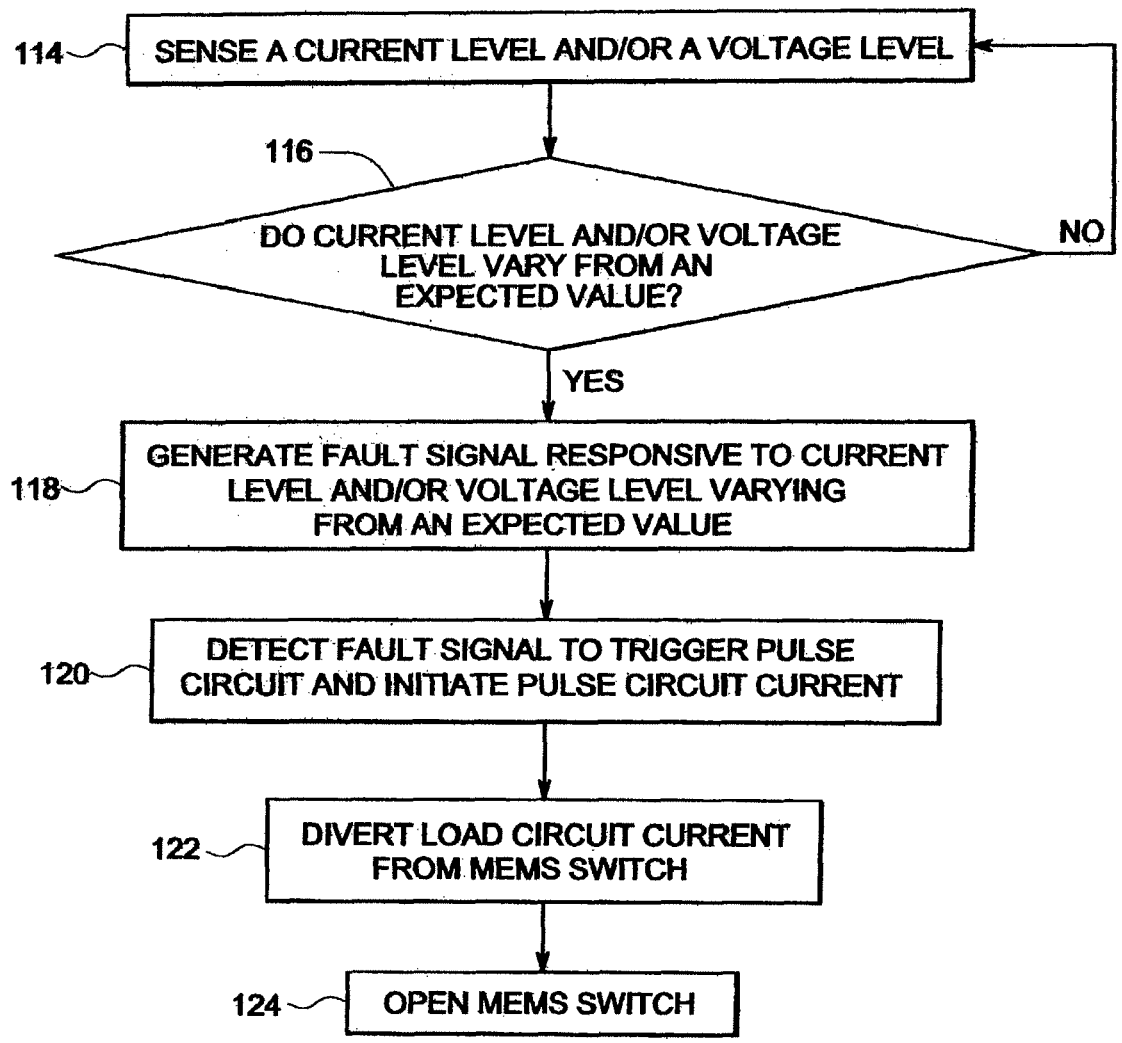
FIG. 8 is a flow diagram depicting an operational flow of a system having the MEMS based switching system illustrated in FIG. 1.

FIG. 8 is a flow chart of exemplary logic 112 for switching a MEMS based switching system from a present operating state to a second state. In accordance with exemplary aspects of the present technique, a method for switching is presented. As previously noted, detection circuitry may be operatively coupled to the arc suppression circuitry and configured to detect a switch condition. In addition, the detection circuitry may include sensing circuitry configured to sense a current level and/or a voltage level.

As indicated by block 114, a current level in a load circuit, such as the load circuit 40 (see FIG. 2), and/or a voltage level may be sensed, via the sensing circuitry, for example. Additionally, as indicated by decision block 116 a determination may be made as to whether either the sensed current level or the sensed voltage level varies from or exceeds an expected value. In one embodiment, a determination may be made (via the detection circuitry, for example) as to whether the sensed current level or the sensed voltage level exceeds respective predetermined threshold levels. Alternatively, voltage or current ramp rates may be monitored to detect a switch condition without a fault having actually occurred.

If the sensed current level or sensed voltage level varies or departs from an expected value, a switch condition may be generated as indicated by block 118. As previously noted, the term "switch condition" refers to a condition that triggers changing a present operating state of the MEMS switch. In certain embodiments, the switch condition may be generated responsive to a fault signal and may be employed to facilitate initiating opening of the MEMS switch. It may be noted that blocks 114-118 are representative of one example of generating a switch condition. However as will be appreciated, other methods of generating the switch condition are also envisioned in accordance with aspects of the present invention.

As indicated by block 120, the pulse circuit may be triggered to initiate a pulse circuit current responsive to the switch condition. Due to the resonant action of the pulse circuit, the pulse circuit current level may continue to increase. Due at least in part to the diode bridge 28, a near-zero voltage drop may be maintained across the contacts of the MEMS switch if the instantaneous amplitude of the pulse circuit current is significantly greater than the instantaneous amplitude of the load circuit current. Additionally, the load circuit current through the MEMS switch may be diverted from the MEMS switch to the pulse circuit as indicated by block 122. As previously noted, the diode bridge presents a path of relatively low impedance as opposed to a path through the MEMS switch, where a relatively high impedance increases as the contacts of the MEMS switch start to part. The MEMS switch may then be opened in an arc-less manner as indicated by block 124.

As previously described, a near-zero voltage drop across contacts of the MEMS switch may be maintained as long as the instantaneous amplitude of the pulse circuit current is significantly greater than the instantaneous amplitude of the load circuit current, thereby facilitating opening of the MEMS switch and suppressing formation of any arc across the contacts of the MEMS switch. Thus, as described hereinabove, the MEMS switch may be opened at a near-zero voltage condition across the contacts of the MEMS switch and with a greatly reduced current through the MEMS switch.

Figure 9:
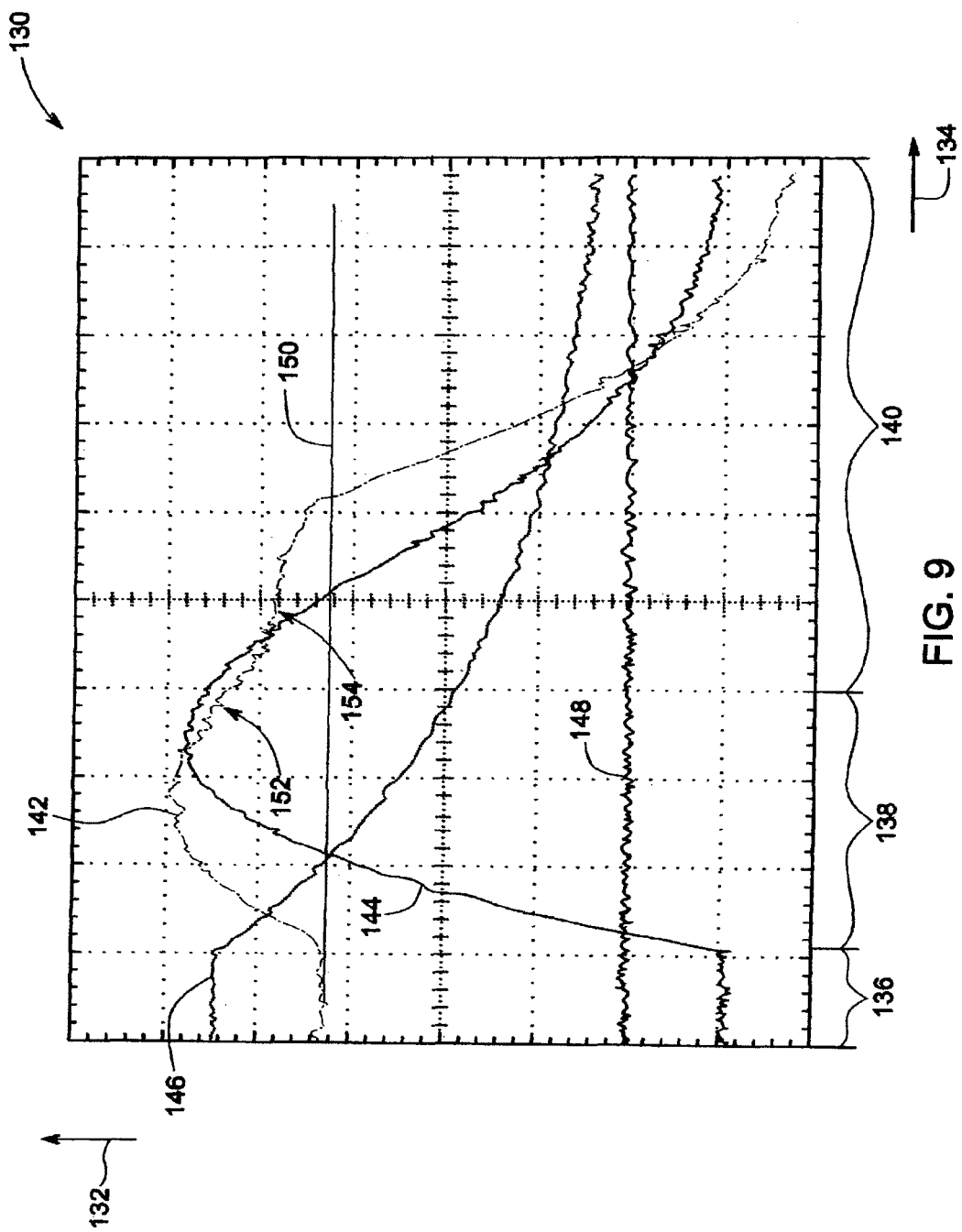
FIG. 9 is a graphical representation of experimental results representative of turn off of the switching system.

FIG. 9 is a graphical representation 130 of experimental results representative of switching a present operating state of the MEMS switch of the MEMS based switching system, in accordance with aspects of the present technique. As depicted in FIG. 9, a variation in amplitude 132 is plotted against a variation in time 134. Also, reference numerals 136, 138 and 140 are representative of a first section, a second section, and a third section of the graphical illustration 130.

Response curve 142 represents a variation of amplitude of the load circuit current as a function of time. A variation of amplitude of the pulse circuit current as a function of time is represented in response curve 144. In a similar fashion, a variation of amplitude of gate voltage as a function of time is embodied in response curve 146. Response curve 148 represents a zero gate voltage reference, while response curve 150 is the reference level for the load current prior to turn-off.

Additionally, reference numeral 152 represents region on the response curve 142 where the process of switch opening occurs. Similarly, reference numeral 154 represents a region on the response curve 142 where the contacts of the MEMS switch have parted and the switch is in an open state. Also, as can be seen from the second section 138 of the graphical representation 130, the gate voltage is pulled low to facilitate initiating opening of the MEMS switch. Furthermore, as can be seen from the third section 140 of the graphical representation 130, the load circuit current 142 and the pulse circuit current 144 in the conducting half of the balanced diode bridge are decaying.

Figure 10:
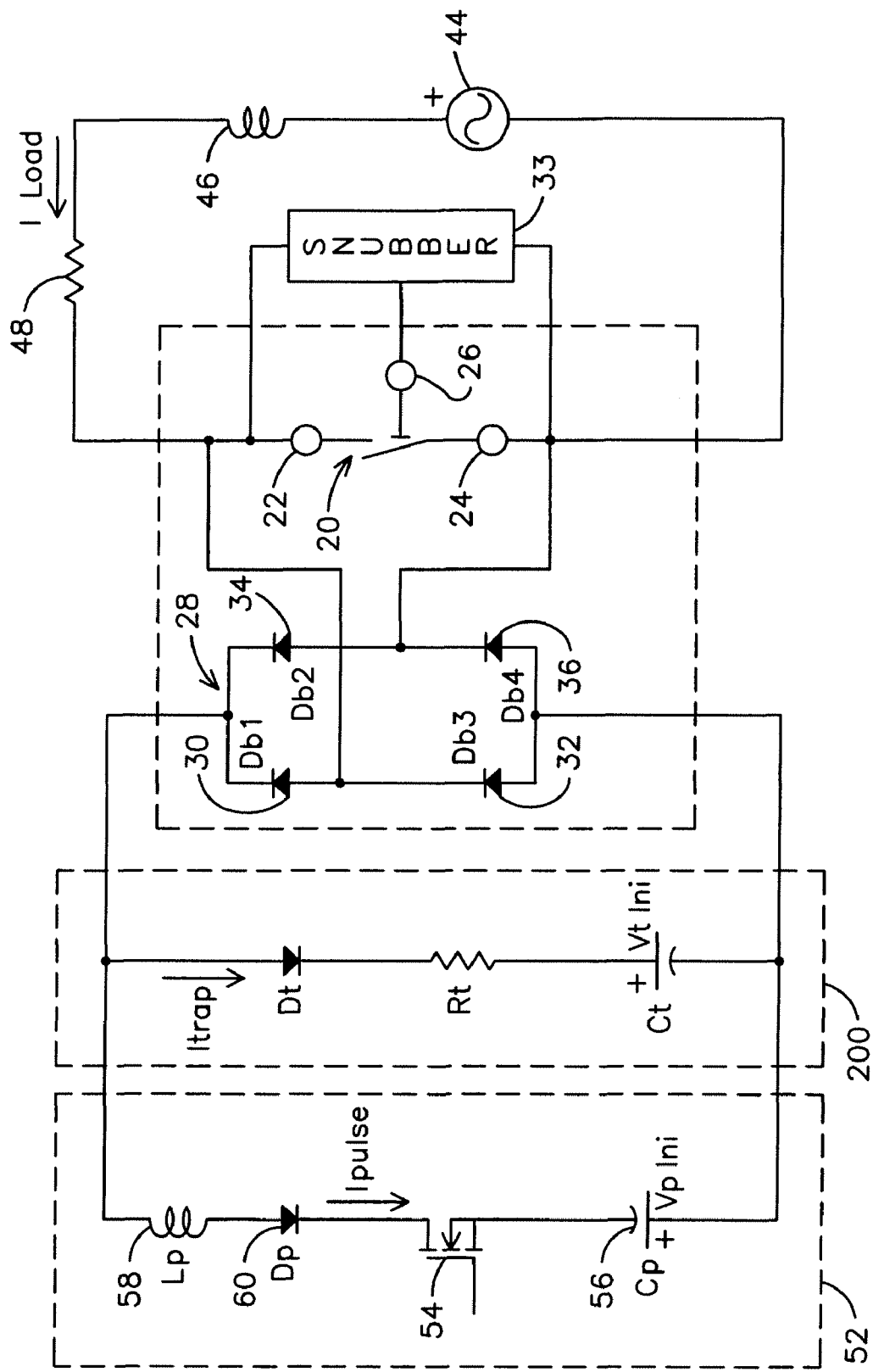
FIG. 10 is schematic diagram illustrating an exemplary MEMS-based switching system, in accordance with aspects of the present invention.

Additional aspects of the present invention comprise the addition of an energy-absorbing circuitry 200, shown in FIG. 10, adapted to absorb (e.g., trap or take up) electrical energy during a switched load current interruption of a protected load circuit, such as may occur in response to a fault condition. This circuitry is connected in a parallel circuit with balanced diode bridge 28. It is contemplated that this addition will enable optimization of load current interruption due to fault conditions that may develop in the load circuit and will be conducive to a decreased amount of let-through current in switching circuitry embodying aspects of the present invention. Moreover, aspects of the present invention should simplify the circuit design process, and should further enable optimization of circuitry components in a MEMS-based switching system, such as enabling appropriate circuitry selection for a given application, and reduced weight and cost of the switching system.

In one example embodiment, energy-absorbing circuitry 200 is connected across the DC side of balanced diode bridge 28 in parallel with pulse circuit 52 as shown in FIG. 10. Circuitry 200 may comprise a resistor Rt, a diode Dt, and an energy-absorbing element, such as a capacitor Ct. For purposes of description of operational interactions effected by circuitry 200, let us begin upon the opening of MEMS switch 20 to a non-conductive state, and upon a turning off of the two mutually diagonal bridge diodes (e.g., diodes 32 and 34) that may be shedding current during the process for limiting fault current. The diode bridge voltage will rapidly rise above an initial voltage value (VtIni) stored on capacitor Ct and diode Dt will then turn on. It will be appreciated that electrical energy, which is stored in capacitor Ct upon occurrence of a fault, may be readily discharged by way of a suitable discharge resistor (not shown in FIG. 10).

The inventors of the present invention have innovatively recognized structural and/or operational relationships that permit independent optimization of pulse circuit 52 and energy-absorbing circuitry 200 for a given circuit breaker application. This optimization can result in an appropriate selection of components and/or substantial cost reductions for a given application. For example, the value of pulse capacitor Cp and its initial voltage (VpIni) may be advantageously selected (e.g., selecting a sufficiently small capacitance value for capacitor Cp) to achieve an optimum peak pulse current and/or pulse width independent of energy-absorbing capacitor Ct. That is, independent of energy trapping requirements that otherwise would have to be carried out by way of pulse capacitor Cpulse in addition to the pulse-forming requirements. Similarly, the value of energy-absorbing capacitor Ct and its initial voltage (VtIni) can be independently selected (e.g., selecting a sufficiently large capacitance value for energy-absorbing capacitor Ct) for rapid absorption of the fault energy during a fault interval. That is, independent of the pulse-forming requirements carried out by way of capacitor Cp.

A circuit arrangement embodying aspects of the present invention should result in a reduced amount of fault let-through current and lower breaker energy dissipation. As noted above, diode bridge 28 and MEMS switch 20 may be packaged to be closely integrated with one another (e.g., composite packaging) for reduction of parasitic inductance in the diode bridge and the respective interconnections to the MEMS switch. This incrementally reduces the amount of electrical energy that may be stored in such interconnections. Otherwise, during the opening of the MEMS switch, a corresponding incremental amount of electrical energy would have to be dissipated by the opening contacts of the MEMS switch since the additional inductance of the interconnections to snubber 33 would diminish effecting protective action by the protective circuitry (e.g., snubber 33) connected across MEMS switch 20 at the instant the contacts disengage. It is noted that one important function of snubber 33 is to retard (e.g., slow down) the rise of the voltage across the MEMS switch during the opening motion of the contacts to prevent arcing due to excessive voltage gradient buildup until full separation and voltage hold-off capability has been achieved.

In operation, (in response to a fault that can develop in the load circuit) reliable and substantially rapid turn-off of the load current may be accomplished through the following example sequence of events, as may be performed in a MEMS-based switching system embodying aspects of the present invention: Capacitors Cpulse and Ct may be respectively initially charged with the respective example voltage polarities shown in FIG. 10 to initial voltages VpInit and VtInit. MEMS switch 20 initially will be in an ON (e.g., conductive) state in response to a gating signal applied via contact gate 26. Upon occurrence of a fault, load current will rise at a relatively fast rate (e.g., high value of di/dt). For example, when the magnitude of the load current exceeds a predefined threshold value and/or the rate of change (di/dt) of the load current exceeds a predefined value, pulse switch 54 is triggered to an ON state. The value of Ipulse current will then increase to a suitable preset (design) value that exceeds the fault current value. As previously discussed, the pulsed diode bridge 28 is configured to cause a nearly zero voltage drop across MEMS switch 20. At a time just prior to reaching the peak value of Ipulse current, MEMS switch 20 will be gated to an OFF (non-conductive) state.

As the MEMS switch contact pressure decreases in response to a decreasing gating signal, the increasing contact resistance forces a current transfer from the load circuit to the diode bridge 28. Current flow through switch contacts 22 and 24 decreases to essentially zero prior to the separation of these contacts. Contacts 22 and 24 will be open under a nearly zero voltage condition. The fault current will now be carried by diode bridge 28. The value of Ipulse current will decrease (e.g., in a sinusoidal manner) after reaching its peak value. When the value of Ipulse current decreases to a value that matches the instantaneous value of the increasing fault current, diodes D2 and D3 will cease to conduct. At this point, diodes D1 and D4 will conduct the fault current from the load circuit. Also pulse capacitor Cpulse decreases in voltage until its voltage polarity reverses. The increase in the magnitude of the reverse voltage being stored on capacitor Cpulse by the fault current will oppose bus source voltage 44 and will cause a decrease in the rise rate of fault current, di/dt.

The voltage across the DC input to diode bridge 28 will then increase rapidly and when its value reaches the initial voltage (VtInit) stored on capacitor Ct, diode Dt will begin to conduct and circuitry 200 will take up the fault current. Capacitor Ct, as it is being charged, creates a reverse emf which reverses the rise rate of fault current (e.g., negative di/dt). For instance, when the voltage on capacitor Ct reaches the bus source voltage, then the fault current will decrease to zero. From the foregoing description, it will be appreciated that energy-absorbing capacitor Ct is adapted to absorb fault-resulting electrical energy independent of the pulse circuit, and to cause the extremely rapid reduction of load current to zero through its resonant action with the load and pulse inductances.

It will be appreciated that a circuit arrangement embodying aspects of the present invention advantageously separates the functions provided by capacitors Ct and Cpulse. Furthermore, the circuit branch with the energy-absorbing capacitor Ct may be conceptualized to function as a "snubber" in the sense of controlling (e.g., restraining) the rate-of-change (e.g., rate-of-rise) of the voltage across the diode bridge as well as absorbing the load/source system energy. This may be achieved in one example embodiment with an adjustable pre-charge on capacitor Ct.

Figure 11:
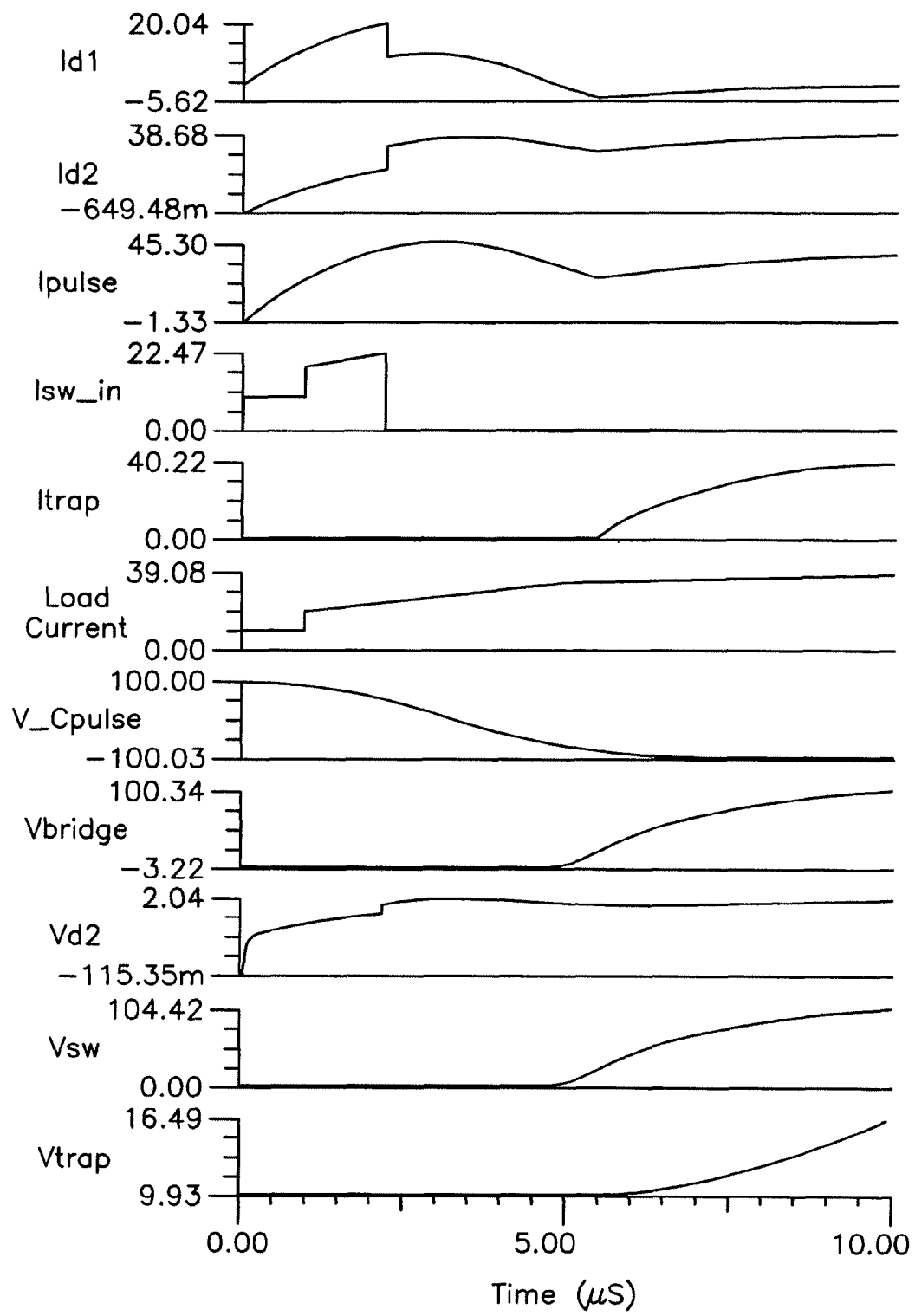
FIGS. 11 and 12 respectively illustrate a graphical representation of simulation results of example circuit signals illustrative of operational details of the switching system of FIG. 10, in accordance with aspects of the present invention.

FIG. 11 synthesizes in graphical form the operational concepts discussed above through simulated circuit signals plotted as a function of time for the MEMS-based switching system shown in FIG. 10. These signals are plotted over an example time interval of 10 microseconds (as may be useful for appreciating operational details regarding an example initial transient response of the switching system) during a switched turn-off of the load current in response to a fault condition while FIG. 12 shows such simulated circuit signals plotted over a longer time interval, such as 120 microseconds, (as may be useful for appreciating operational details over that longer time interval and regarding an example response of the switching system subsequent to turn-off of the load current).

Figure 12:
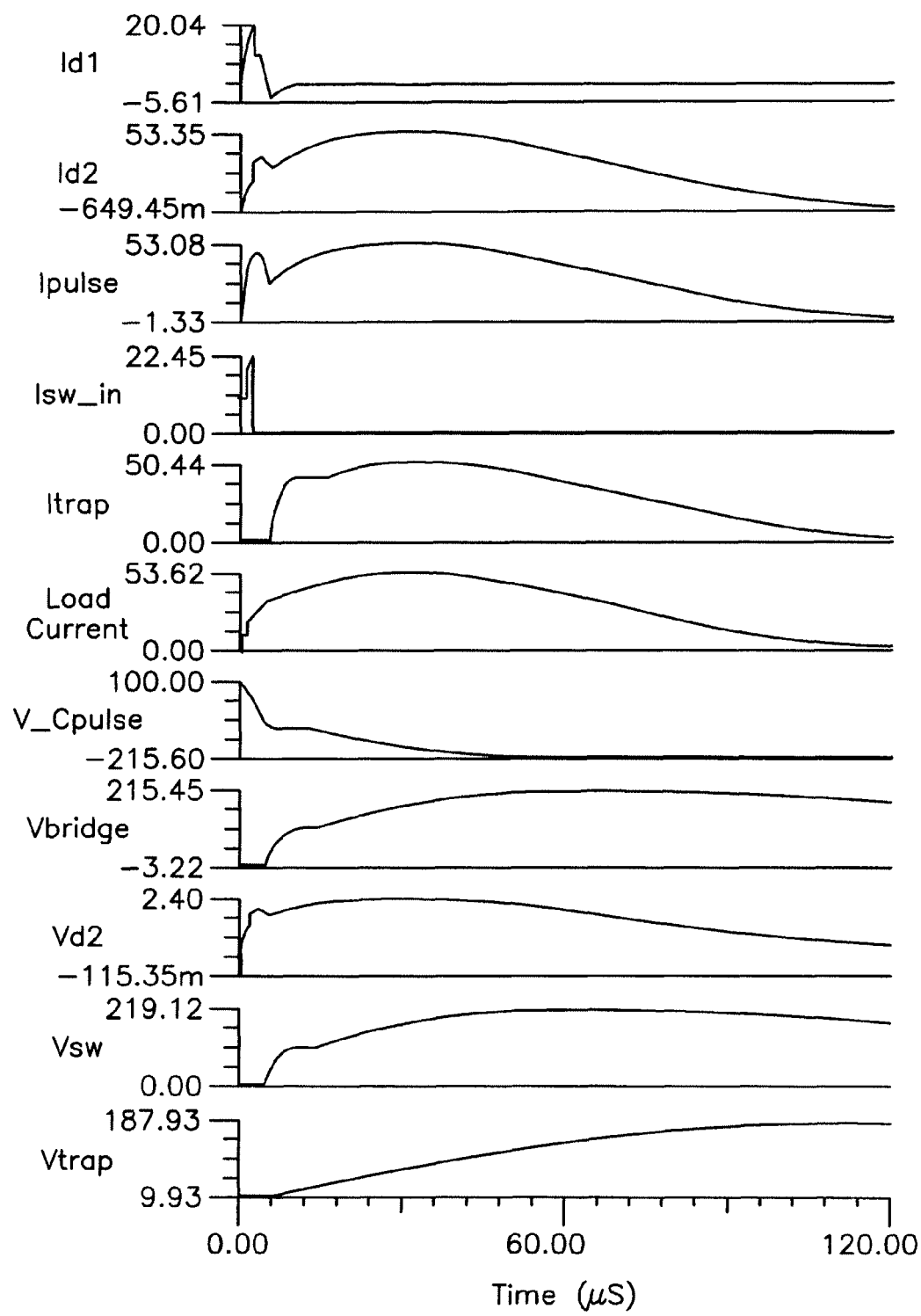

The signal plots in FIGS. 11 and 12 are identified as follows in reference to the system shown in FIG. 10: Id1 and Id2 represent currents respectively conducted by bridge diodes D1 and D2. Ipulse represents pulse current. Isw_in represents current flow through contacts 22 and 24 of MEMS switch 20. Itrap represents current flow through energy-absorbing circuitry 200. Load Current represents a load current in response to a fault condition, as such current is effectively limited by the system shown in FIG. 10. V_Cpulse represents a voltage across pulse capacitor 56. Vbridge represents a voltage across diode bridge 28. Vd2 represents a voltage across diode D2. Vsw represents a voltage across contacts 22 and 24 of MEMS switch 20. Vtrap represents a voltage across energy-absorbing capacitor Ct.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A system comprising:
a micro-electromechanical system switch;
a balanced diode bridge configured to suppress arc formation between contacts of the micro-electromechanical system switch;
a pulse circuit coupled to the balanced diode bridge, the pulse circuit comprising a pulse capacitor adapted to form a pulse signal for causing flow of a pulse current through the balanced diode bridge, the pulse signal being generated in response to a switch condition in a load circuit coupled to the micro-electromechanical system switch;
energy-absorbing circuitry coupled in a parallel circuit with the pulse circuit, the energy-absorbing circuitry comprising an energy-absorbing capacitor and a diode connected in series, the energy-absorbing capacitor being charged to store an initial voltage value prior to the switch condition and the diode being so connected as to be in a reverse-biased state when the energy-absorbing capacitor is charged to store the initial voltage value, and in a conductive state when a voltage developed across the diode bridge reaches the initial voltage value stored in the energy-absorbing capacitor; and
wherein the energy-absorbing capacitor is further adapted to absorb electrical energy from the load circuit and not affect pulse signal formation by the pulse circuit, and the conductive state of the diode in the energy-absorbing circuitry causes the energy absorbing capacitor to receive current from the load circuit only after the voltage across the diode bridge surpasses the initial voltage value.

2. The system of claim 1 wherein a capacitance value of the pulse capacitor is selected to control one or more pulse signal characteristics of the pulse signal independent of a capacitance value of the energy-absorbing capacitor.

3. The system of claim 2 wherein the one or more pulse signal characteristics of the pulse signal are selected from the group consisting of a width of the pulse signal, a peak of the pulse signal, and a combination of the width and the peak of the pulse signal.

4. The system of claim 1 wherein a capacitance value of the energy-absorbing capacitor is selected to control an amount of electrical energy absorbed by the energy-absorbing capacitor independent of a capacitance value of the pulse capacitor.

5. The system of claim 1, wherein the balanced diode bridge comprises a first branch and a second branch, and wherein the first branch comprises a first diode and a second diode coupled in a first series circuit and the second branch comprises a third diode and a fourth diode coupled in a second series circuit.

6. The system of claim 5, wherein the micro-electromechanical system switch is coupled in parallel across midpoints of the balanced diode bridge, and wherein a first midpoint is located between the first and second diodes and a second midpoint is located between the third and fourth diodes.

7. The system of claim 1, wherein the micro-electromechanical system switch is integrated with the balanced diode bridge in a single package.

8. The system of claim 1, wherein the pulse circuit is further configured to detect a switch condition and initiate opening of the micro-electromechanical system switch responsive to the fault condition.

9. The system of claim 1, further comprising a first plurality of micro-electromechanical switches electrically coupled in a series circuit.

10. The system of claim 9, wherein at least one of the first plurality of micro-electromechanical switches is further coupled in a parallel circuit comprising a second plurality of micro-electromechanical switches.

11. The system of claim 1, wherein the energy-absorbing capacitor is further adapted to receive current from the load circuit so as to charge and create a reverse emf to reverse the rate of rise of current in the load circuit when the diode in energy-absorbing circuitry is in the conductive state.

12. The system of claim 1, wherein the pulse capacitor is configured to decrease a rate of rise of current in the load circuit.

13. A system comprising:
switching circuitry comprising a micro-electromechanical system switch configured to switch the system from a first switching state to a second switching state;
arc suppression circuitry coupled to the switching circuitry, wherein the arc suppression circuitry is configured to suppress an arc formation between contacts of the micro-electromechanical system switch;
detection circuitry coupled to the arc suppression circuitry and configured to determine existence of a switch condition of an electrical load circuit coupled to the switching circuitry;
a pulse circuit coupled to the arc suppression circuitry and the detection circuitry, wherein the pulse circuit is configured to form a pulse signal responsive to the switch condition, and wherein the pulse signal is applied to the arc suppression circuitry in connection with initiating an opening of the micro-electromechanical system switch;
energy-absorbing circuitry coupled in a parallel circuit with the pulse circuit, the energy-absorbing circuitry comprising an energy-absorbing capacitor and a diode connected in series, the energy-absorbing capacitor being charged to store an initial voltage value prior to the switch condition and said diode being so connected as to be in a reverse-biased state when the energy-absorbing capacitor is charged to store an initial voltage value, and in a conductive state when a voltage developed across the arc suppression circuitry reaches the initial voltage value stored in the energy-absorbing capacitor; and
wherein the energy-absorbing capacitor is further adapted to absorb electrical energy from the load circuit and not affect a pulse signal formation by the pulse circuit, and the conductive state of the diode in the energy-absorbing circuitry causes the energy absorbing capacitor to receive current from the load circuit only after the voltage across the diode bridge surpasses the initial voltage value.

14. The system of claim 11, wherein the arc suppression circuitry comprises a balanced diode bridge coupled in a parallel circuit with the micro-electromechanical system switch.

15. The system of claim 11, wherein the pulse circuit comprises a pulse capacitor that affects one or more characteristics of the pulse signal.

16. The system of claim 15, wherein the pulse capacitor decreases a rate of rise of current associated with a switch condition.

17. The system of claim 15 wherein a capacitance value of the energy-absorbing capacitor is selected to control an amount of electrical energy absorbed by the energy-absorbing capacitor independent of a capacitance value of the pulse capacitor.

18. The system of claim 17 wherein a capacitance value of the pulse capacitor is selected to control the one or more pulse signal characteristics of the pulse signal independent of the capacitance value of the energy-absorbing capacitor.

19. The system of claim 18 wherein the one or more pulse signal characteristics of the pulse signal are selected from the group consisting of a width of the pulse signal, a peak of the pulse signal, and a combination of the width and the peak of the pulse signal.

20. The system of claim 13, wherein the energy-absorbing capacitor is further adapted to receive current from the load circuit so as to charge and create a reverse emf to reverse the rate of rise of current in the load circuit when the diode in energy-absorbing circuitry is in the conductive state.

* * * * *

UNITED STATES PATENT AND TRADEMARK OFFICE
CERTIFICATE OF CORRECTION

| | | |
|---|---|---|
| PATENT NO. | : 8,050,000 B2 | Page 1 of 1 |
| APPLICATION NO. | : 12/967526 | |
| DATED | : November 1, 2011 | |
| INVENTOR(S) | : Wright et al. | |

It is certified that error appears in the above-identified patent and that said Letters Patent is hereby corrected as shown below:

On the Title Page, in Field (75), under "Inventors", in Column 1, Line 2, delete "Kanakasabqapathi" and insert -- Kanakasabapathi --, therefor.

In Column 6, Line 35, delete "($V_{BUS}/I_{LOAD}$)" and insert -- ($V_{BUS}/L_{LOAD}$) --, therefor.

In Column 14, Line 35, in Claim 13, delete "are" and insert -- arc --, therefor.

Signed and Sealed this
Thirty-first Day of January, 2012

David J. Kappos
*Director of the United States Patent and Trademark Office*